United States Patent
Ogawa

(10) Patent No.: US 7,550,788 B2
(45) Date of Patent: Jun. 23, 2009

(54) SEMICONDUCTOR DEVICE HAVING FUSE ELEMENT ARRANGED BETWEEN ELECTRODES FORMED IN DIFFERENT WIRING LAYERS

(75) Inventor: Sumio Ogawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 38 days.

(21) Appl. No.: 11/651,027

(22) Filed: Jan. 9, 2007

(65) Prior Publication Data

US 2007/0176256 A1    Aug. 2, 2007

(30) Foreign Application Priority Data

Jan. 31, 2006    (JP)    ............... 2006-021887

(51) Int. Cl.
| | | |
|---|---|---|
| H01L 27/10 | (2006.01) | |
| H01L 29/73 | (2006.01) | |
| H01L 29/74 | (2006.01) | |
| H01L 29/00 | (2006.01) | |
| H01L 23/58 | (2006.01) | |
| H01L 23/62 | (2006.01) | |
| H01L 23/48 | (2006.01) | |
| H01L 23/52 | (2006.01) | |
| H01L 29/40 | (2006.01) | |

(52) U.S. Cl. .............. 257/209; 257/207; 257/208; 257/211; 257/529; 257/665; 257/758; 257/759; 257/760

(58) Field of Classification Search ......... 257/207–209, 257/211, 529, 665, 758–760

See application file for complete search history.

(56) References Cited

U.S. PATENT DOCUMENTS

| | | | |
|---|---|---|---|
| 6,100,118 A * | 8/2000 | Shih et al. ............... | 438/132 |
| 6,429,503 B2 * | 8/2002 | Lehr et al. ............... | 257/530 |
| 6,756,655 B2 * | 6/2004 | Le et al. .................. | 257/529 |
| 6,806,551 B2 * | 10/2004 | Liu et al. ................ | 257/529 |
| 6,867,441 B1 * | 3/2005 | Yang et al. .............. | 257/209 |
| 7,009,274 B2 * | 3/2006 | Kim ........................ | 257/529 |
| 7,095,119 B2 * | 8/2006 | Takase .................... | 257/758 |
| 7,361,967 B2 * | 4/2008 | Takahashi et al. ....... | 257/529 |
| 2002/0171119 A1 * | 11/2002 | Sasaki ..................... | 257/529 |
| 2002/0175416 A1 | 11/2002 | Hashimoto | |
| 2005/0239273 A1 * | 10/2005 | Yang ....................... | 438/601 |

FOREIGN PATENT DOCUMENTS

| | | |
|---|---|---|
| JP | 6-119796 | 4/1994 |
| JP | 7-74254 | 3/1995 |
| JP | 9-36234 | 2/1997 |
| JP | 9-69299 | 3/1997 |
| JP | 2003-501835 | 1/2003 |
| JP | 2005-136060 | 5/2005 |
| KR | 2002-90316 | 12/2002 |

* cited by examiner

*Primary Examiner*—Ida M Soward
(74) *Attorney, Agent, or Firm*—Young & Thompson

(57) ABSTRACT

A semiconductor device includes a lower electrode, an upper electrode, and a fuse element that connects the lower electrode and the upper electrode. The height of the fuse element is greater than the depth of focus of a laser beam to be irradiated. The diameter of the fuse element is smaller than the diffraction limit of the laser beam. Thus, in the present invention, a vertically long fuse element is used, so that it is possible to efficiently absorb the energy of the laser beam. It is possible to cut the fuse element by using an optical system having a small depth of focus, so that the damage imposed on a member located above or below the fuse element is very small. As a result, the fuse element can be without destructing the passivation film.

24 Claims, 17 Drawing Sheets

SEMICONDUCTOR DEVICE HAVING FUSE ELEMENT ARRANGED BETWEEN ELECTRODES FORMED IN DIFFERENT WIRING LAYERS

TECHNICAL FIELD

The present invention relates to a semiconductor device, and more particularly, to a semiconductor device having, a fuse element that can be cut by irradiation with a laser beam. The present invention also relates to a method of cutting a fuse element, and more particularly, to a method of cutting a fuse element by irradiation with a laser beam.

BACKGROUND OF THE INVENTION

The storage density of a semiconductor memory device represented by a DRAM (Dynamic Random Access Memory) is increasing year by year due to advancement in a microfabrication technique. Along with the progress in downsizing, the number of defective memory cells included per one chip is also increasing. Generally, such defective memory cell is replaced by a redundant memory cell, thereby relieving a defective address.

Generally, the defective address is stored in a program circuit including a plurality of fuse elements. When the defective address is accessed, the program circuit detects the access request. As a result, an alternate access is performed not to the defective memory cell but to the redundant memory cell. As the configuration of the program circuit, as described in Japanese Patent Application Laid Open No. H9-69299, there is known a method of storing a desired address by allocating a pair (two) of fuse elements to each bit that constitutes addresses to be stored, and cutting one of the two fuse elements.

There is also known a method of allocating one fuse element to each bit that constitutes addresses to be stored, as described in Japanese Patent Application Laid Open No. H6-119796. In this method, it is possible to store one bit by whether to cut the one fuse element. Thus, it becomes possible to greatly reduce the number of fuse elements.

As a method of cutting a fuse element, there are known, roughly, two methods. One method is to fuse the fuse element with a high current (see Japanese Patent Application Laid Open Nos. 2005-136060 and 2003-501835). The other method is to destruct the fuse element by irradiation with a laser beam (see Japanese Patent Application Laid Open Nos. H7-74254 and H9-36234). The former method is advantageous in that an expensive device such as a laser trimmer is not required, and whether the fuse element is correctly cut can be easily self-evaluated. However, to use this method, a fuse cutting circuit and a diagnostic circuit need to be employed inside the semiconductor device, which increases the chip area.

In contrast, in the method of destructing the fuse element by laser beam irradiation, the fuse cutting circuit or the like need not be employed inside the semiconductor device. Accordingly, it is possible to reduce the chip area. However, in this method, a passivation film is also destructed by laser beam irradiation. As a result, moisture enters from the destructed area, which often becomes a cause of a decrease in reliability of the semiconductor device.

In the method of destructing the fuse element by laser beam irradiation, materials of the destructed passivation film, the fuse element, and the like scatter, and debris adheres to an objective lens that converges the laser beam. To prevent the adhesion of the debris, an optical system having a relatively large focal distance can be used to provide a distance between the objective lens and the semiconductor device. In this optical system, however, inevitably, it becomes necessary to make a numerical aperture (NA) of the objective lens small. As a result, the depth of focus becomes large, so that a high density energy is applied not only to the fuse element to be cut but also to members located above or below the fuse element. This makes it impossible to arrange a wiring and a transistor immediately above or below the fuse element.

Further, holes extending in a crater shape are formed on the passivation film irradiated with the laser beam. To prevent the crater or a crack caused thereby from affecting other fuse elements, it is necessary to arrange adjacent fuse elements with a sufficient distance provided therebetween. This makes it difficult to enhance an arrangement density of the fuse elements.

SUMMARY OF THE INVENTION

As explained above, the method of destructing the fuse element by laser beam irradiation is advantageous for reducing the chip area. However, there are various problems including imposing of heavy damage on members, for example, the passivation film, existing immediately above or below the fuse element.

The present invention has been achieved in order to solve the above problems, and an object thereof is to provide an improved semiconductor device having a fuse element that can be cut by laser beam irradiation, and an improved method of cutting the fuse element.

Another object of the present invention is to provide a semiconductor device and a method of cutting a fuse element that can cut the fuse element with a laser beam without destructing a passivation film.

Still another object of the present invention is to provide a semiconductor device and a method of cutting a fuse element that can reduce damage imposed on a member existing immediately above or below the fuse element.

Still another object of the present invention is to provide a semiconductor device and a method of cutting a fuse element that can cut the fuse element by using an objective lens having a large numerical aperture.

Still another object of the present invention is to provide a semiconductor device and a method of cutting a fuse element that can reduce a distance between adjacent fuse elements.

A semiconductor device according to one aspect of the present invention, comprising: a lower electrode arranged in a first wiring layer; an upper electrode arranged in a second wiring layer located higher than the first wiring layer; and a fuse element that connects the lower electrode and the upper electrode, a height of the fuse element being at least three times greater than a diameter of the fuse element.

A method of cutting a fuse element according to one aspect of the present invention, comprising the step for irradiating a laser beam to the fuse element, the laser beam has a depth of focus smaller than a height of the fuse element, and has a diffraction limit greater than a diameter of the fuse element.

The "height of a fuse element" used herein means the length of the fuse element in a direction perpendicular to a principal surface of a semiconductor device. The "diameter of a fuse element" means the length of the fuse element in a direction parallel to the principal surface of the semiconductor device. When the diameter of the fuse element is not constant, an average size thereof is used.

In the present invention, the fuse element preferably has a tubular shape having a hollow portion therein. This shape enables more reliable cutting of the fuse element by laser beam irradiation. In the present invention, the "tubular shape" is a mere concept including a cylindrical shape, a prismatic shape, and the like. The inner diameter and the outer shape need not to be constant in a height direction.

According to the present invention, since the energy of the laser beam can be efficiently absorbed by the vertically long fuse element, when the fuse element is cut by using an optical system having a depth of focus smaller than the height of the fuse element, the damage imposed on the member located above or below the fuse element is small. When the optical system having a small depth of focus is used, the margin of the focal position in the up and down directions decreases. However, according to the present invention, the fuse element is vertically long, so that the margin of the focal position in the up and down directions can be sufficiently secured. In particular, recently, a warpage of a semiconductor wafer chronically occurs as the semiconductor wafer grows in size. Due to this tendency, a deviation of the focal position in the up and down directions occurs very easily. However, according to the present invention, the deviation of the focal position, which is caused due to the warpage of the semiconductor wafer, can be solved by the vertically long fuse element.

In such optical system, the objective lens having a large numerical aperture is used, so that the energy density imposed on the passivation film is very small, compared to the conventional case. As a result, it is possible to cut the fuse element without destructing the passivation film.

The damage imposed above or below the fuse element is very small, so that it is also possible to arrange a wiring or a transistor above or below the fuse element. Since the objective lens having a large numerical aperture is used, the beam spot at a position deviated from the focal point is made very large, compared to the conventional case. Thus, it is possible to greatly narrow the distance between the adjacent fuse elements.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 5A shows an example in which an objective lens having a relatively small numerical aperture is used, and FIG. 5B shows an example in which an objective lens having a relatively large numerical aperture is used;

DETAILED DESCRIPTION OF THE EMBODIMENTS

Preferred embodiment of the present invention will now be explained in detail with reference to the drawings.

Figure 1:
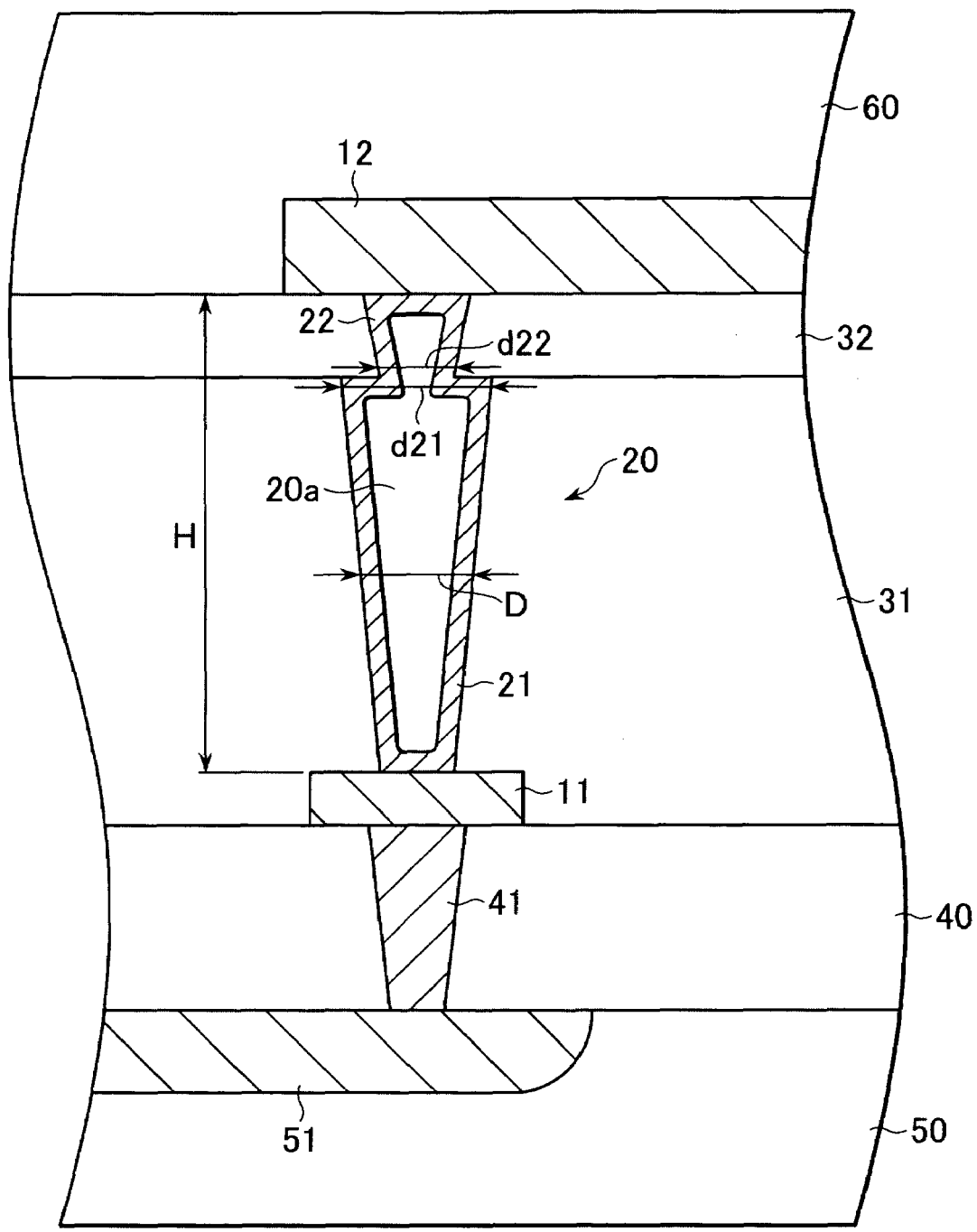
FIG. 1 is a schematic cross section of the structure of a fuse element included in a semiconductor device according to a preferred embodiment of the present invention.

FIG. 1 is a schematic cross section of the structure of a fuse element included in a semiconductor device according to a preferred embodiment of the present invention.

As shown in FIG. 1, a semiconductor device according to this embodiment includes a lower electrode 11, an upper electrode 12, and a fuse element 20 that connects the lower electrode 11 and the upper electrode 12. The lower electrode 11 and the upper electrode 12 are formed in wiring layers different from each other. Accordingly, the height of the fuse element 20 that connects these electrodes is the same as the total thickness of insulating films 31 and 32 that separate the lower electrode 11 and the upper electrode 12.

The lower electrode 11 is connected to a diffused layer 51 provided in a semiconductor substrate 50 via a through-hole electrode 41 provided in an insulating film 40. The material for the lower electrode 11 is not particularly limited, but tungsten (W) or the like is preferably used.

The upper electrode 12 is a wiring of the top layer, for example, and is covered with a passivation film 60. The material for the upper electrode 12 is not particularly limited, but aluminum (Al) or the like is preferably used.

The fuse element 20 has a tubular shape with a hollow portion 20a therein, as shown in FIG. 1. The hollow portion 20a contains gases such as one used for film formation. A method of forming the fuse element 20 with such shape is explained later.

As shown in FIG. 1, a height H of the fuse element 20 is sufficiently greater than a diameter D. More specifically, the height H is set to at least three times greater than the diameter D, preferably set to at least five times greater, more preferably set to about 10 times to 20 times greater. Although the detail of such shape is described later, the reason for such a vertically long shape is to efficiently absorb energy of a laser beam to be irradiated, and to sufficiently secure a margin of a focal position in up and down directions.

While a specific numerical value of the height H of the fuse element 20 is not particularly limited, the numerical value is preferably larger than the depth of focus of the laser beam to be irradiated, and more preferably at least two times larger than the depth of focus. With such value, even when the focal point of the laser beam slightly deviates in the up and down directions, the focal point is almost always at the fuse element 20. Further, it becomes possible to greatly reduce components of energy, out of the energy of the irradiated laser beam, that leak below the fuse element 20.

The depth of focus (DOF) can be represented by the following equation (1), where λ is the wavelength of the laser beam to be irradiated, and NA is the numerical aperture of an objective lens that converges the laser beam.

$$DOF = \frac{\lambda}{NA^2} \tag{1}$$

Accordingly, when the wavelength of the laser beam to be irradiated is 300 nm and the numerical aperture of the objective lens is 0.548, the depth of focus (DOF) is nearly 1 μm. When the fuse element 20 is cut by using such optical system, the height H of the fuse element 20 can be set to 1 μm or more. In this case, the height H of the fuse element 20 is preferably about 3 μm.

On the other hand, although a specific numerical value of the diameter D of the fuse element 20 is not particularly limited, the numerical value is preferably smaller than a diffraction limit of the laser beam to be irradiated, and more preferably, half or less than the diffraction limit. With such value, it becomes possible to more surely cut the fuse element 20, and enhance the packaging density of the fuse element 20.

When the diameter D of the fuse element 20 is set smaller than the diffraction limit, a certain component of the energy with which the fuse element 20 is not irradiated leaks below the fuse element 20. However, the intensity of the laser beam is imparted with a Gaussian distribution, which means that the inner the area on the Gaussian distribution, the higher the intensity, and thus, the leaking energy in the edge portions is not so high. Further, the fuse element 20 has a vertically long shape, and a large portion of the energy is absorbed by the fuse element 20, as explained above. As a result, the component of the energy that leaks below the fuse element 20 is very small.

The diffraction limit (DL) can be represented by the following equation (2), where λ is the wavelength of the laser beam to be irradiated, and NA is the numerical aperture of an objective lens that converges the laser beam.

$$DL = 0.61 \times \frac{\lambda}{NA} \tag{2}$$

Accordingly, similar to the above, when the wavelength of the laser beam to be irradiated is 300 nm and the numerical aperture of the objective lens is 0.548, the diffraction limit (DL) is about 330 nm. When such optical system is used to cut the fuse element 20, the diameter D of the fuse element 20 can be set to 300 nm or less. In this case, the diameter D of the fuse element 20 is preferably about 200 nm.

Although the material for the fuse element 20 is not particularly limited, tungsten (W) is preferably used because tungsten (W) is excellent as a conductive material forming a tubular shape, and tungsten (W) also has high absorptivity of light in an ultraviolet range.

As shown in FIG. 1, the fuse element 20 is arranged so as to penetrate the insulating film 31 located on the lower electrode 11 side and the insulating film 32 located on the upper electrode 12 side. The fuse element 20 includes a first tubular portion 21 that penetrates the insulating film 31 and a second tubular potion 22 that penetrates the insulating film 32. In this embodiment, a diameter d22 at the lower end of the second tubular potion 22 is set smaller than a diameter d21 at the upper end of the first tubular portion 21. While the detail of this shape is explained later, the reason for this shape is to suppress growth of the first tubular portion 21 at the time of film formation, and to form the hollow portion 20a.

Figure 2:
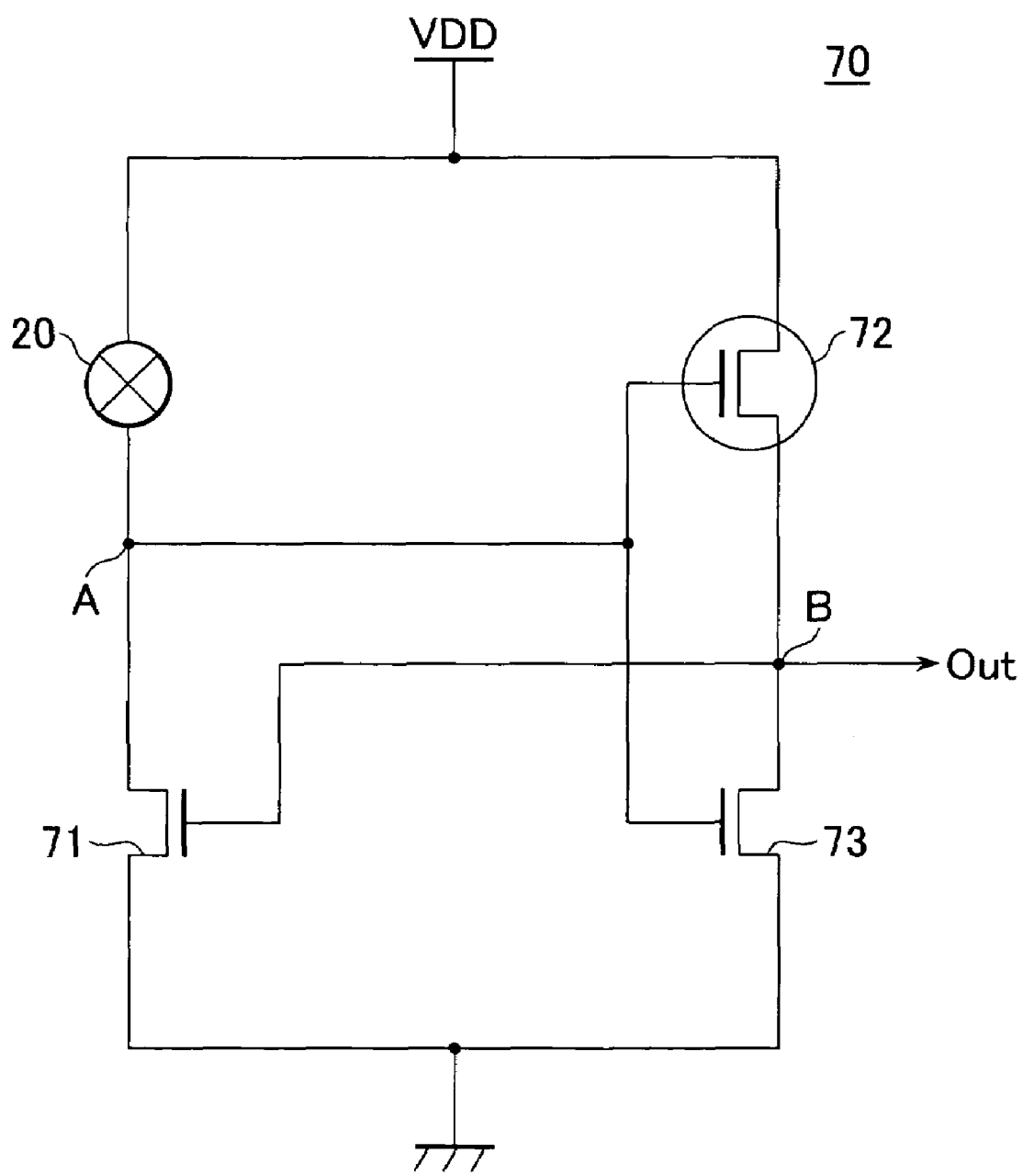
FIG. 2 is a circuit diagram of an example of a program circuit using the fuse element shown in FIG. 1.

FIG. 2 is a circuit diagram of an example of a program circuit using the fuse element 20.

A program circuit 70 shown in FIG. 2 includes: the fuse element 20 and an N-channel MOS transistor 71 connected in series between a power supply potential VDD and a ground potential GND; and a P-channel MOS transistor 72 and an N-channel MOS transistor 73 connected in series between the power supply potential VDD and the ground potential GND. A connection point A between the fuse element 20 and the transistor 71 is commonly connected to gate electrodes of the transistors 72 and 73. A connection point B (output terminal) between the transistors 72 and 73 is connected to a gate electrode of the transistor 71.

With this configuration, when the fuse element 20 is cut, a potential of the connection point A is a low level, so that the connection point B, which is the output terminal, is connected to the power supply potential VDD via the transistor 72. Thus, an output Out is fixed at a high level. In contrast, when the fuse element 20 is not cut, the potential of the connection point A is a high level, so that the connection point B, which is the output terminal, is connected to the ground potential GND via the transistor 73. Thus, the output Out is fixed at a low level.

Accordingly, when the fuse element 20 is used to configure such program circuit 70, a logical value of the output Out is determined according to whether the fuse element 20 is cut. Thus, the use of a plurality of such program circuits 70 enables storing of defective addresses, for example.

The cutting of the fuse element 20 is performed by irradiating a laser beam via the passivation film 60. That is, the tubular fuse element 20 having the hollow portion 20a therein is irradiated with a laser beam from an axial direction.

Figure 3:
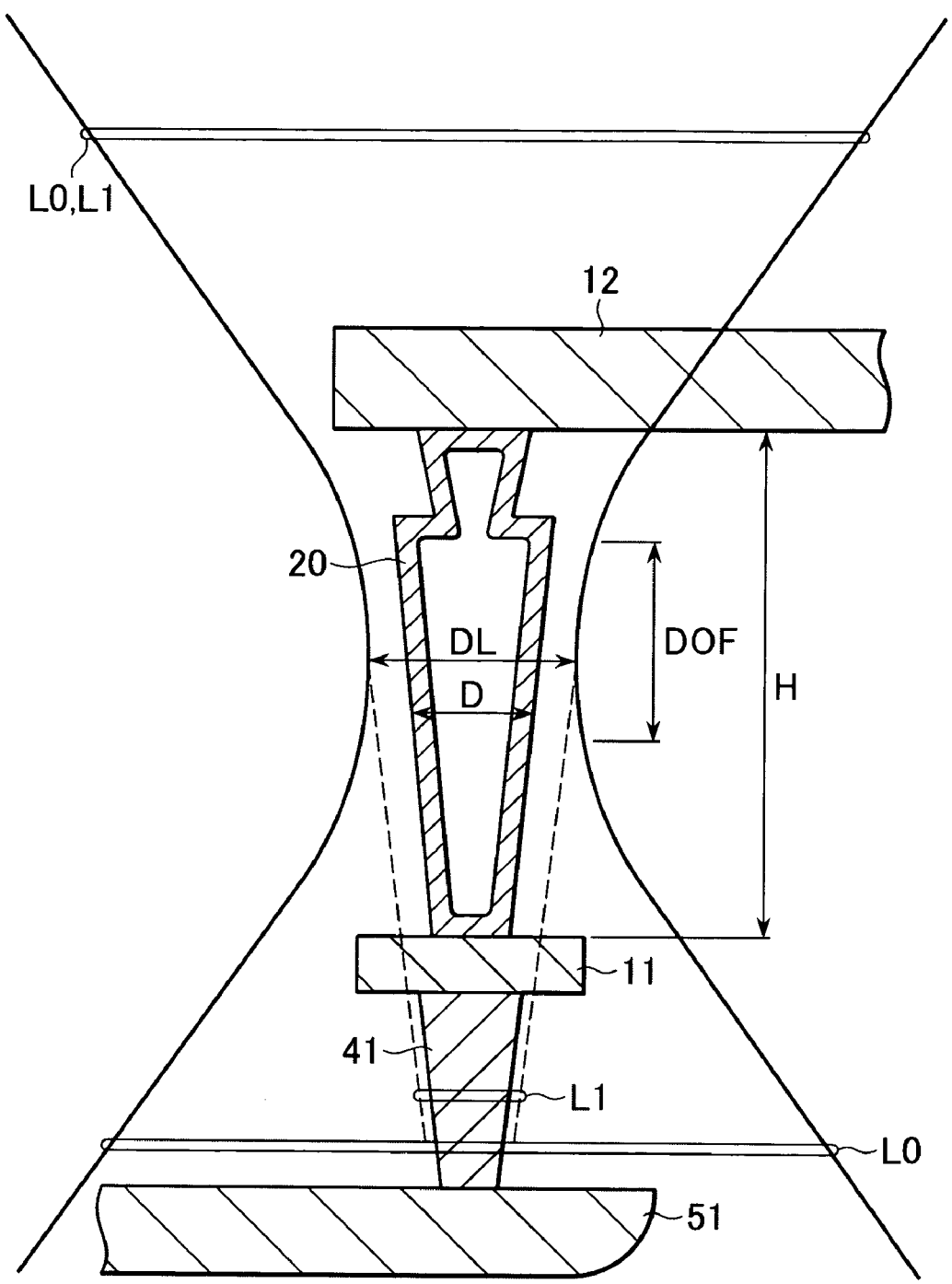
FIG. 3 is a schematic diagram for explaining a method of cutting the fuse element shown in FIG. 1 with a laser beam.

FIG. 3 is a schematic diagram for explaining a method of cutting the fuse element 20 with a laser beam. In FIG. 3, a reference sign L0 indicates an original beam diameter of a laser beam, and L1 indicates an actual beam diameter of the laser beam. The "original beam diameter" used herein means a beam diameter when the fuse element 20 is not irradiated with a laser beam. The "actual beam diameter" used herein means a beam diameter when the fuse element 20 is irradiated with a laser beam.

The laser beam passes through an objective lens (not shown) and is converged in a region where the fuse element 20 is formed. The diffraction limit of the laser beam is determined by the equation (1). When the wavelength of the laser beam is 300 nm and the numerical aperture of the objective lens is 0.548, the diffraction limit (DL) is about 330 nm, as explained above. On the other hand, the diameter D of the fuse element 20 can be scaled down to ¼ of an exposure wavelength by a super resolution technology in which a phase shift mask or the like is used. Accordingly, as shown in FIG. 3, even when the laser beam is converged onto the fuse element 20, a certain component of the laser beam with which the fuse element 20 is not irradiated leaks out below the fuse element 20.

However, when an optical system in which the depth of focus (DOF) is equal to or less than the height of the fuse element 20 is used, or preferably, an optical system in which the depth of focus (DOF) is half or less than the height of the fuse element 20 is used, energy of which the main components have high intensity is absorbed by the fuse element 20. Thus, energy that leaks below the fuse element 20 is very small. As a result, only a thin laser beam of which intensity is weak leaks below the fuse element 20, as indicated by a dotted line L1 in FIG. 3.

As for the energy of the laser beam that leaks below the fuse element 20, the greater the height H of the fuse element 20, the weaker. More specifically, when the height H of the fuse element 20 is at least three times greater than the diameter D, an effective attenuation can be secured. In particular, when the height H of the fuse element 20 is set to at least five times greater than the diameter D, the attenuation of the laser beam is sufficient. When the height H of the fuse element 20 is set to about 10 to 20 times greater than the diameter D, the attenuation of the laser beam is even more sufficient. However, when a ratio between the height H and the diameter D of the fuse element 20 is extremely large, the aspect ratio becomes large. Thus, it becomes difficult to manufacture the fuse element 20.

Figure 4:
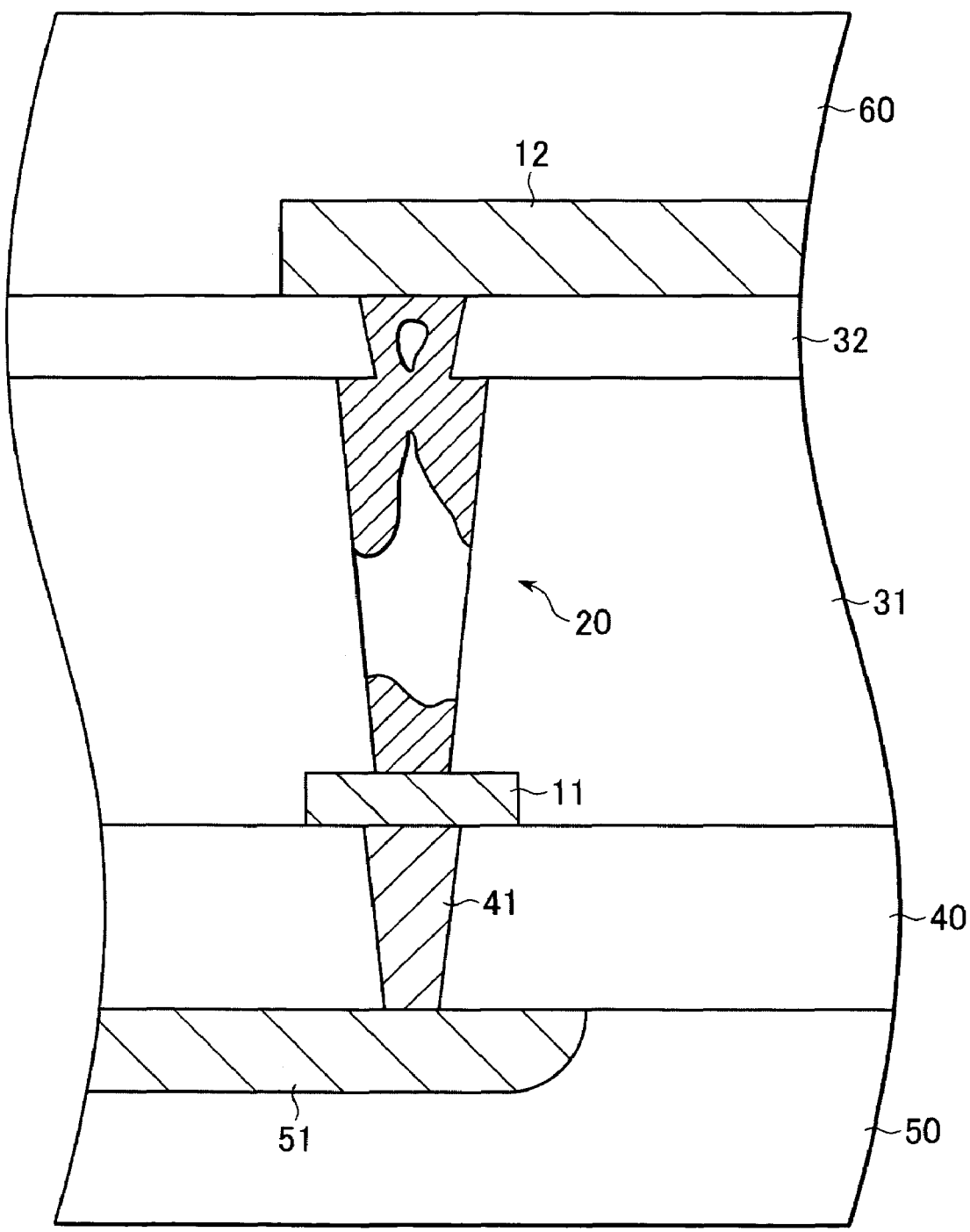
FIG. 4 is a schematic cross section of a fuse element that has been cut.

When the fuse element 20 is irradiated with the laser beam, the tubular structure of the fuse element 20 is collapsed, and the fuse element 20 is separated into upper and bottom portions, as shown in FIG. 4. As a result, the lower electrode 11 and the upper electrode 12 are insulated.

To cut the fuse element 20 more surely, the volume of the hollow portion 20a is preferably sufficiently large. More specifically, the volume of the hollow portion 20a is preferably equal to or larger than that of the fuse element 20. The reason for this is that the larger the volume of the hollow portion 20a, the more easier for the fuse element 20 to be separated into the upper and bottom portions when the fuse element 20 is destructed by laser beam irradiation. Another reason for this is that the larger the volume of the hollow portion 20a, the less likely a crack occurs in the insulating films 31 and 32 because even when an instantaneous cubical expansion occurs due to laser beam irradiation, stress occurring resulting from the expansion is alleviated by the hollow portion 20a.

Thus, in the semiconductor device according to this embodiment, the fuse element 20 has the hollow portion 20a therein, so that when the fuse element 20 is irradiated with the laser beam, an internal destruction of only the fuse element 20 can selectively occur, without greatly damaging the surrounding areas of the fuse element 20.

In the semiconductor device according to this embodiment, the height H of the fuse element 20 is greater than the depth of focus (DOF) of the laser beam, so that it is possible to efficiently absorb the energy of the laser beam to be irradiated. This effective absorption means that it is possible to greatly decrease the power of the laser beam to be irradiated, compared to the conventional case. Further, the height H of the fuse element 20 is greater than the depth of focus (DOF) of the laser beam, so that it is possible to sufficiently secure a margin of the focal position in the up and down directions. This means that it is possible to use an objective lens having a large numerical aperture (NA).

That is, in the semiconductor device according to this embodiment, it is possible to cut the fuse element 20 by using the objective lens having a large numerical aperture and the laser beam of which power is weak. Therefore, the energy density rapidly decreases in an area distant from the focal position even within a beam spot of the laser beam. As a result, the damage imposed on a member located above the fuse element 20 as in the case of the passivation film 60 shown in FIG. 1 and the damage imposed on a member located below the fuse element 20 as in the case of the semiconductor substrate 50 are extremely small compared to the conventional case.

Thus, it becomes possible to cut the fuse element 20 without substantially destructing the passivation film 60. As explained above, the destruction of the passivation film occurring at the time of trimming often gives rise to moisture penetration or the like, which is a cause of a decrease in reliability of the semiconductor device. However, according to this embodiment, such problem is solved, and thus, the reliability of the semiconductor device can be enhanced. Further, the passivation film is not substantially destructed, so that almost no debris occurs at the time of trimming. For these reasons, even when the focal distance is short because the numerical aperture of the objective lens is set large, debris hardly adheres to the objective lens.

Figure 5A:
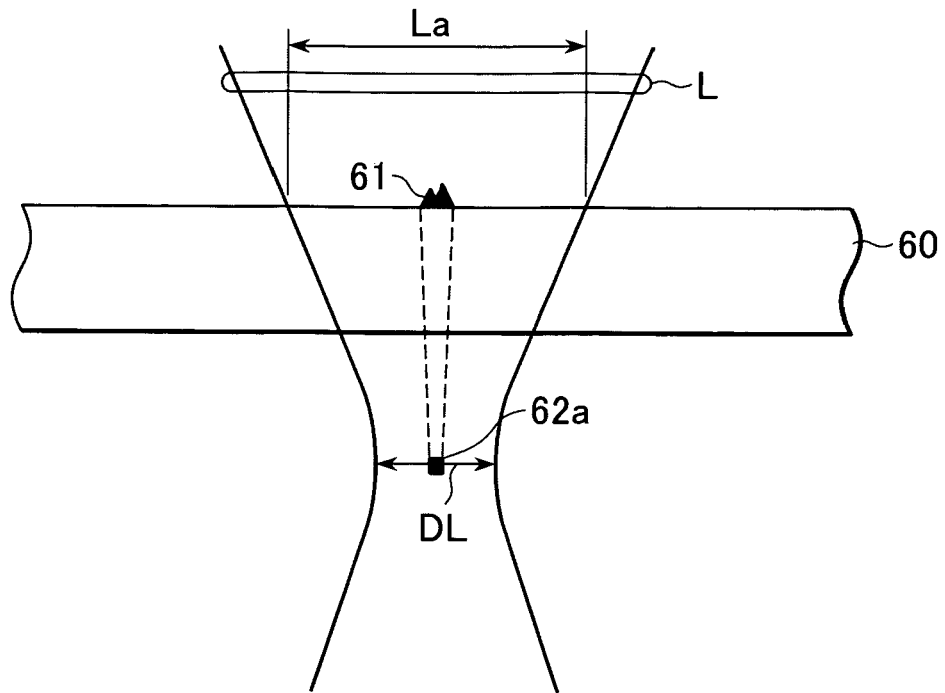
FIGS. 5A and 5B are explanatory diagrams of an influence of dust adhering to a passivation film, where
Figure 5B:
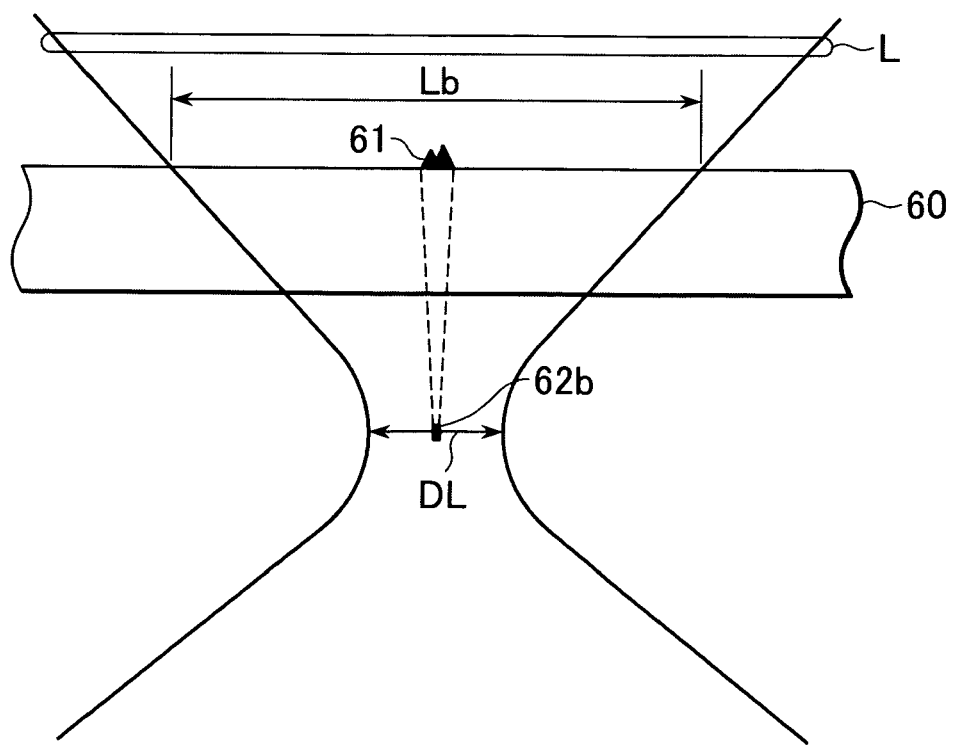

Since the objective lens having a large numerical aperture is used, even when dust adheres to the surface of the passivation film 60, it is possible to suppress the attenuation of the laser beam, which occurs due to the adhesion of the dust. That is, when an objective lens having a relatively small numerical aperture as shown in FIG. 5A is used, and an objective lens having a relatively large numerical aperture as shown in FIG. 5B is used, even when the diffraction limits DL are the same in the both cases, a diameter of the laser beam L on the passivation film 60 is derived as follows:

La<Lb, where La is a diameter in FIG. 5A, and Lb is a diameter in FIG. 5B. Due to this relationship, even when the size of the dust 61 that adheres to the passivation film 60 is the same in the both cases, a relationship between shadows 62a and 62b of the laser beam L occurring thereby is derived as follows:
62a>62b.

This proves that the shadow is smaller when the objective lens having a relatively large numerical aperture is used. Accordingly, when the objective lens having a large numerical aperture is used as in this embodiment, the influence of the dust 61 is reduced.

According to this embodiment, the damage imposed on the member located above or below the fuse element 20 is very small, so that it is possible to arrange another wiring or the like below or above the fuse element 20.

Figure 6:
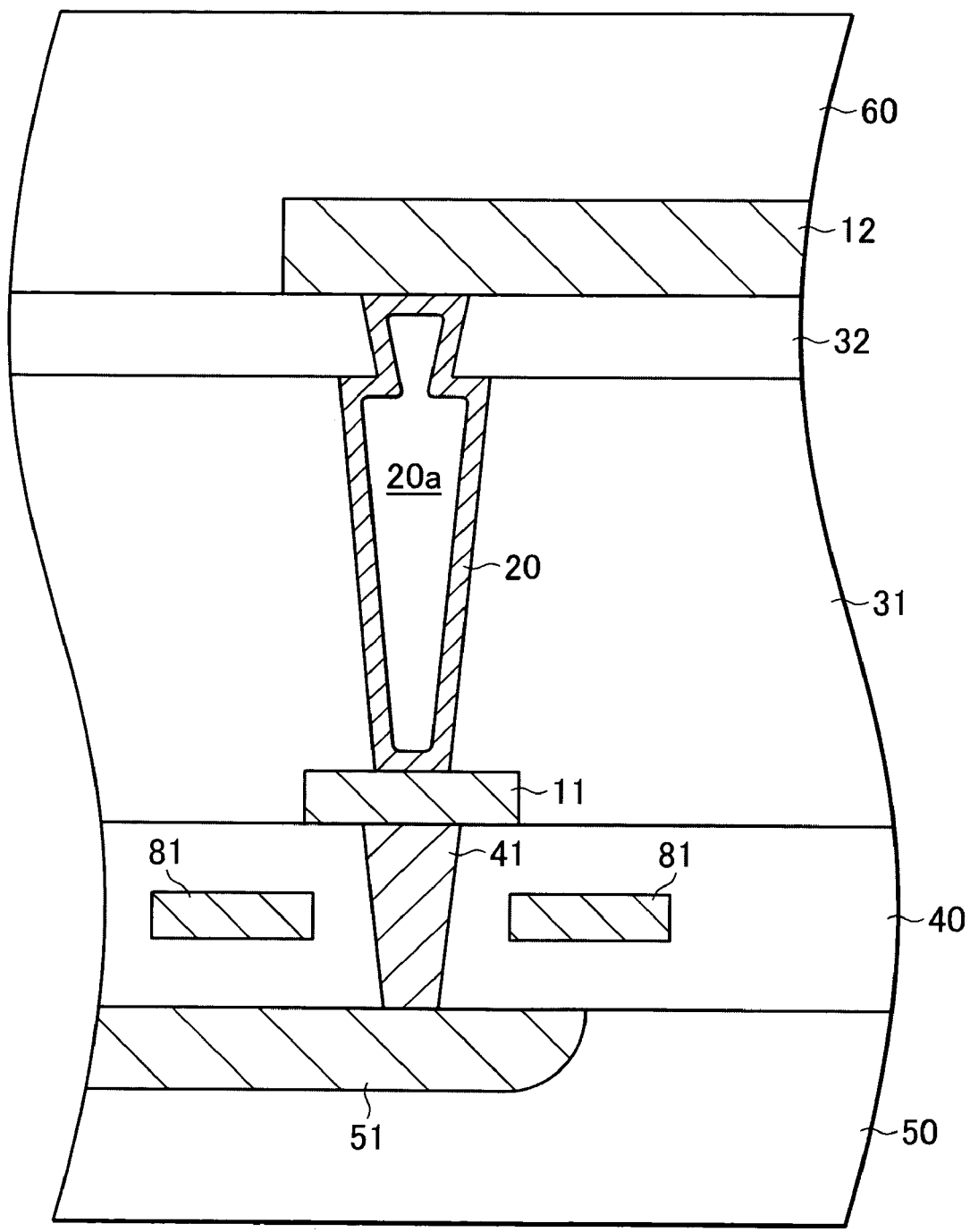
FIG. 6 is a schematic cross section of an example in which another wiring is arranged below the fuse element.
Figure 7:
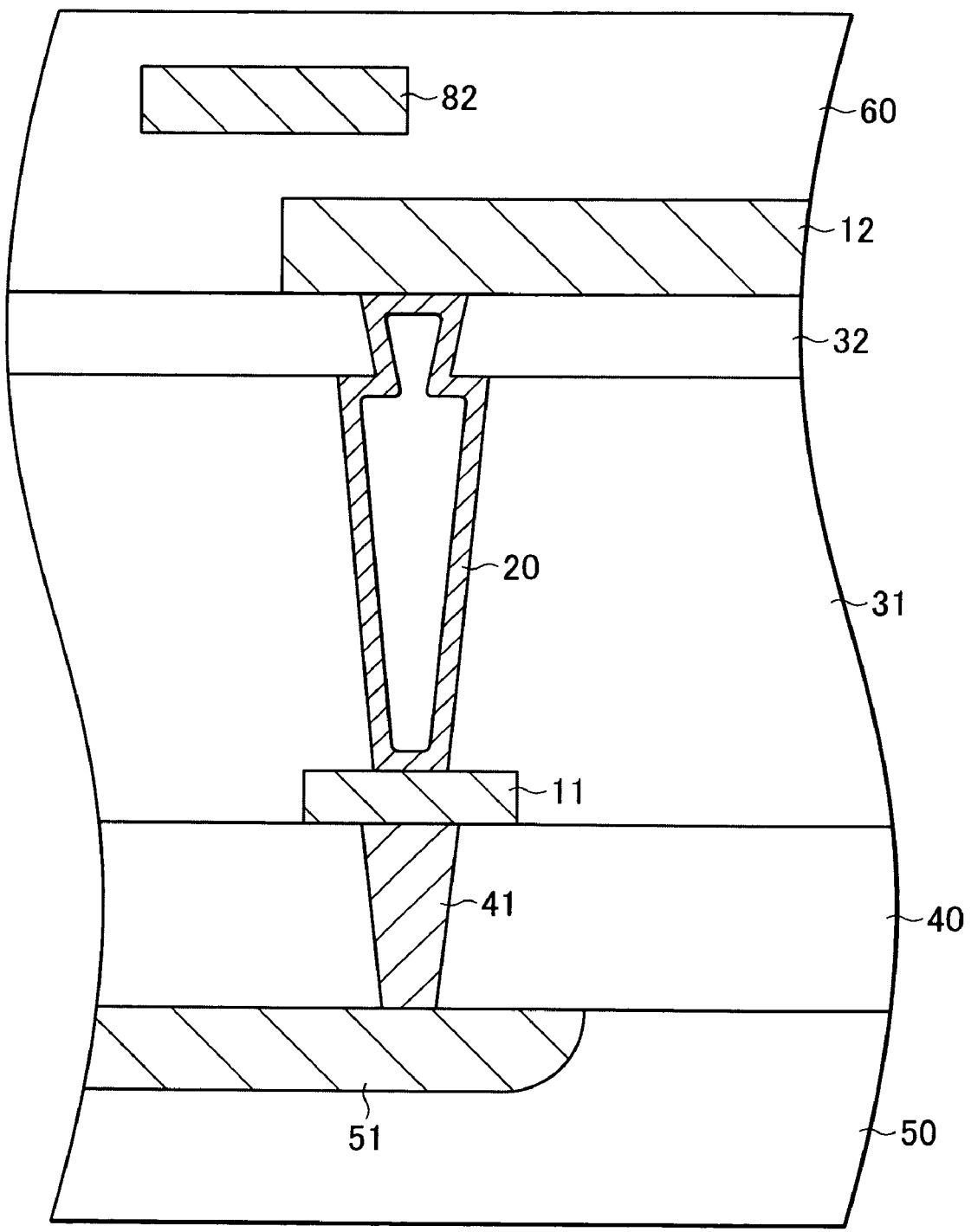
FIG. 7 is a schematic cross section of an example in which another wiring is arranged above the fuse element.

FIG. 6 is a schematic cross section of an example in which another wiring is arranged below the fuse element 20. FIG. 7 is a schematic cross section of an example in which another wiring is arranged above the fuse element 20.

In the example shown in FIG. 6, a wiring 81 is arranged in a wiring layer located below the lower electrode 11. With this arrangement, the wiring 81 is possibly irradiated with the laser beam upon cutting, the fuse element 20. However, since the objective lens having a large numerical aperture is used, the energy density in the area distant from the focal position rapidly decreases, so that the wiring 81 is not destructed. Likewise, in the example shown in FIG. 7, although a wiring 82 is arranged in a wiring layer located above the upper electrode 12, the wiring 82 is not destructed even when the wiring 82 is irradiated with the laser beam upon cutting the fuse element 20.

As for the material for the wiring 81 shown in FIG. 6 and that for the wiring 82 shown in FIG. 7, aluminum (Al), copper (Cu), titanium (Ti), tungsten (W), silicon (Si), or the like is preferably used. In particular, aluminum (Al) is preferably used. The reason for using aluminum (Al) is that aluminum (Al) has low absorptivity of light in an ultraviolet range, which is a wavelength range of the laser beam in use, so that the wirings 81 and 82 are not easily destructed even when irradiated with the laser beam. In this embodiment, since the objective lens having a large numerical aperture is used, even when materials, such as titanium (Ti), and tungsten (W), that have the absorptivity of light higher than that of aluminum (Al) are used, it is still possible to sufficiently prevent the destruction caused by laser beam irradiation.

By taking advantage of the fact that the energy density in the area distant from the focal position is very low, it is possible to greatly narrow the distance between the adjacent fuse elements compared to the conventional case. Although a specific distance between the adjacent fuse elements is not particularly limited, the distance can be set shorter than the height H of each fuse element 20.

Figure 8:
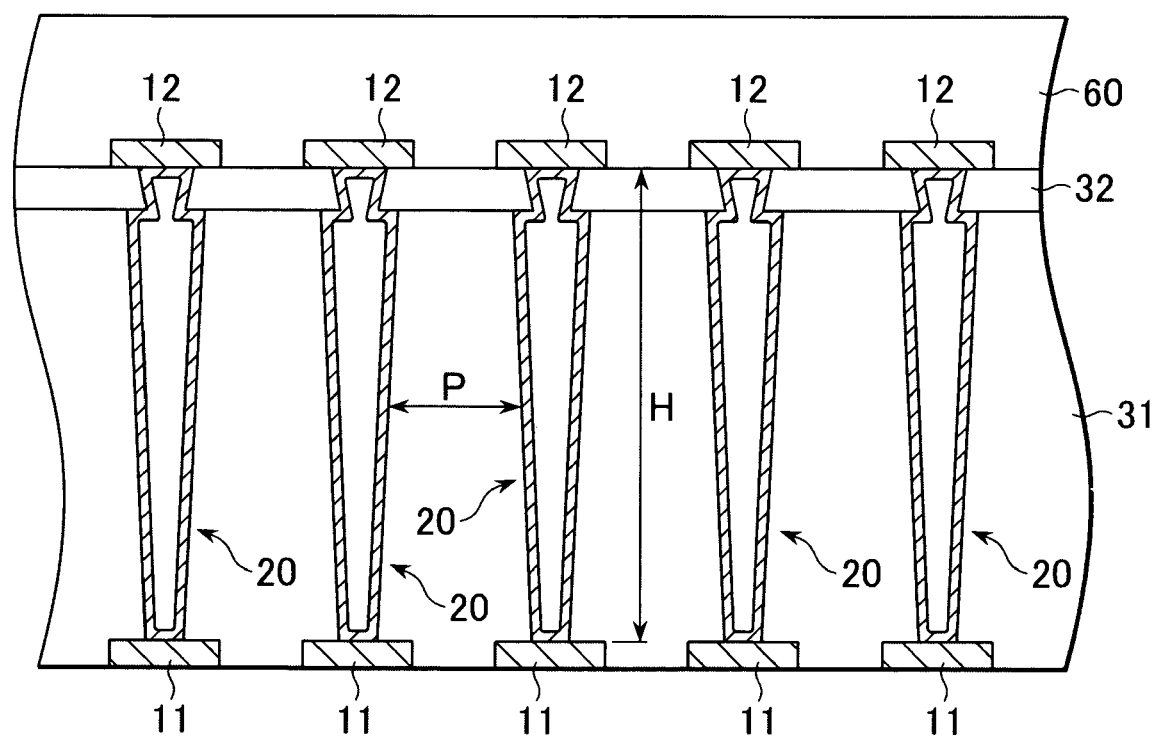
FIG. 8 is a schematic cross section of an example in which a plurality of fuse elements are arranged adjacent to one another.

FIG. 8 is a schematic cross section of an example in which a plurality of fuse elements 20 are arranged adjacent to one another.

In the example shown in FIG. 8, the fuse elements 20 are arranged in one direction, and distances P between the adjacent fuse elements 20 are set to half or less than the height H of the fuse element 20. In an optical system used for a general laser trimmer, it is necessary to provide a sufficient distance between the adjacent fuse elements. However, in this embodiment, since the objective lens having a large numerical aperture and the laser beam having a weak power are used, another fuse element adjacent to the fuse element 20 to be cut suffers almost no damage, and only the target fuse element 20 is selectively and correctly cut.

Figure 9:
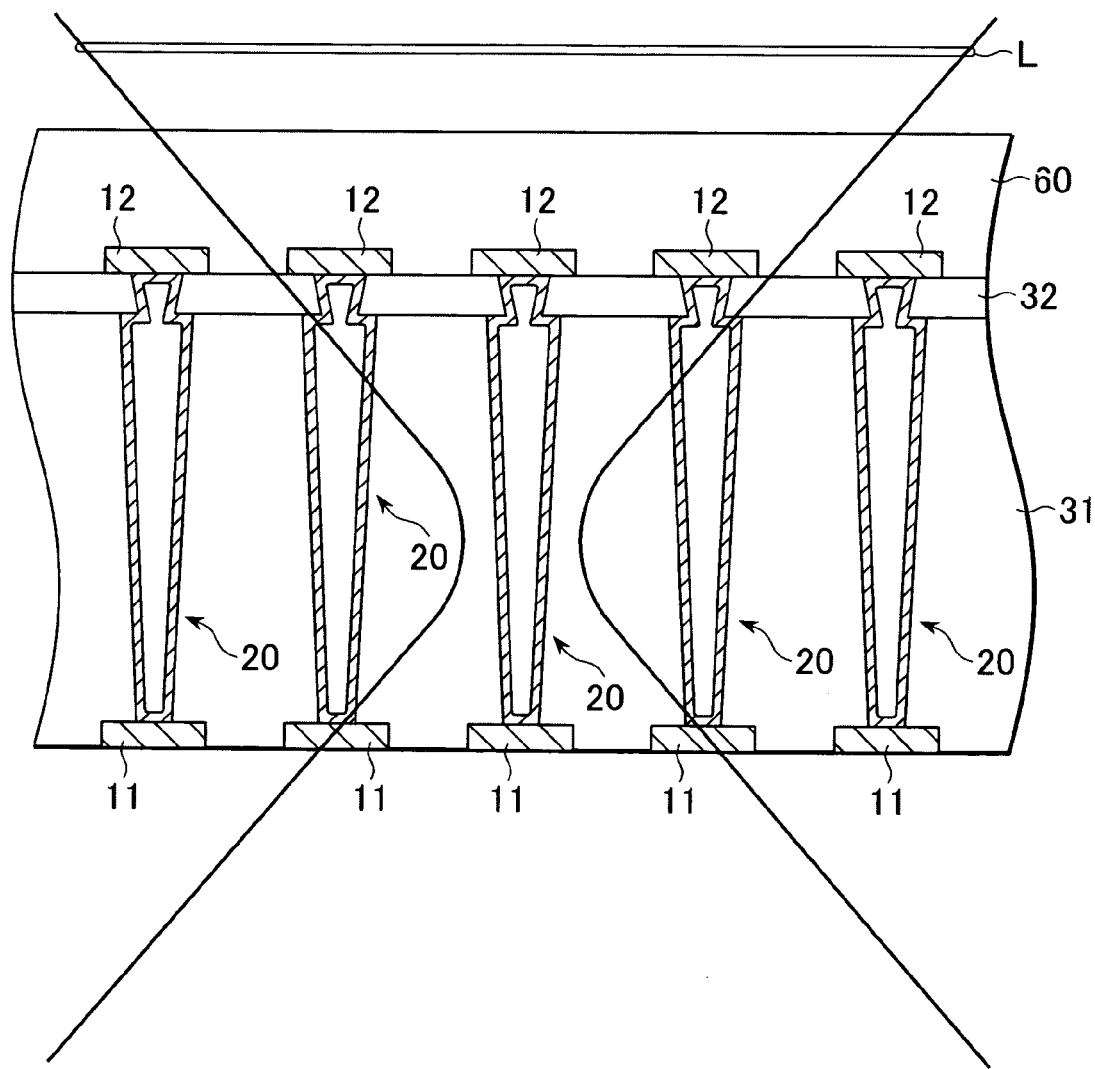
FIG. 9 is a schematic diagram showing a state in which a fuse element different from a fuse element to be cut is irradiated with a laser beam.

That is, as shown in FIG. 9, when a laser beam L is irradiated so that a predetermined fuse element 20 comes into focus, it is inevitable that another fuse element 20, the upper electrode 12 connected to the other fuse element 20, and other parts are irradiated with the laser beam L. However, as explained above, in this embodiment, since the objective lens having a large numerical aperture and the laser beam having a weak power are used, the energy density of a beam spot out of the focal point is very small. Thus, almost no damage is imposed on these parts. Similar to the case in which dust adheres to the passivation film 60, a shadow occurs in the beam spot due to the arrangement of the upper electrode 12 connected to the other fuse element 20. In this case also, since the objective lens having a large numerical aperture is used, it is possible to sufficiently reduce the attenuation caused by the presence of the shadow.

When it is necessary to further reduce the energy attenuation caused by the irradiation of the upper electrode 12 or the like with the laser beam L, the fuse element 20 can be irradiated with the laser beam L slightly obliquely with respect to an axial direction to avoid an area in which the upper electrodes 12 are closely arranged, as much as possible.

Figure 10:
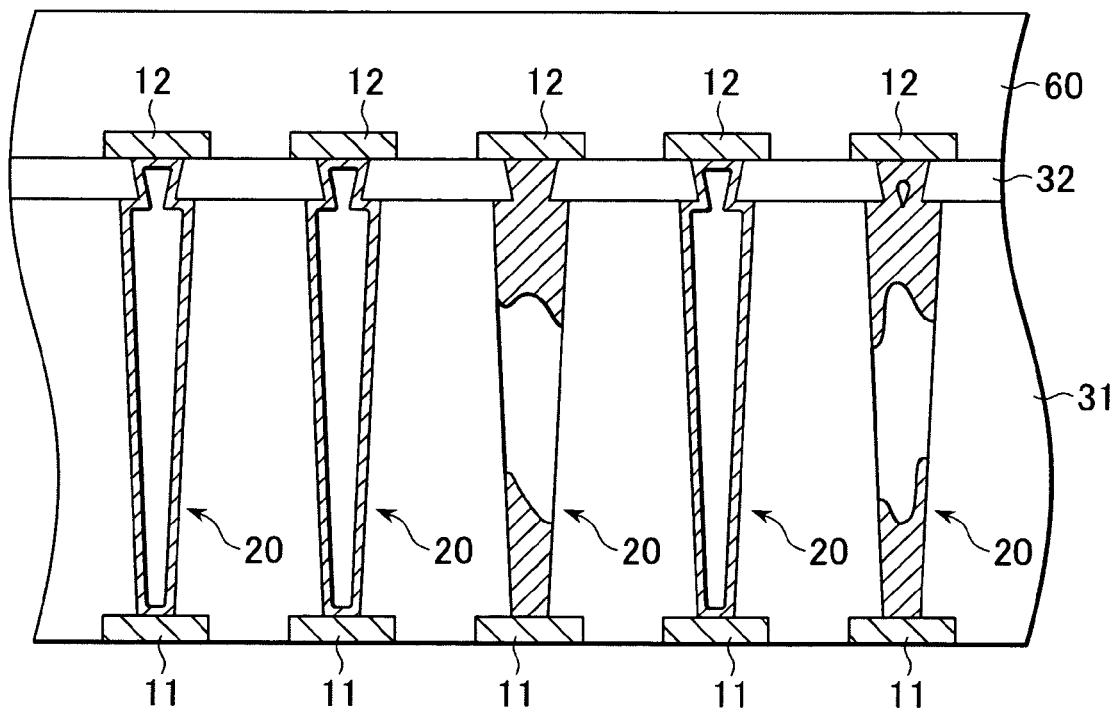
FIG. 10 is a schematic diagram showing a state in which several fuse elements are cut without substantially destructing the passivation film.

Accordingly, when a laser trimming is performed on an array of such fuse elements 20, for example, the passivation film 60 that covers the fuse elements can remain seamless and continuous whereas some portions of the fuse elements are cut as shown in FIG. 10.

In this embodiment, by taking advantage of the fact that the passivation film 60 is not substantially destructed, it becomes possible to irradiate the fuse element with a laser beam by a so-called immersion method, in which liquid is interposed between the objective lens and the passivation film 60. When this method is used, it becomes possible to further increase an effective numerical aperture of the objective lens.

That is, the numerical aperture (NA) is given by the following equation (3), where n is the refractive index of a medium existing on an optical path, and θ is the convergent angle of a laser beam.

$$NA = n \times \sin\theta \quad (3)$$

In general trimming, the medium is air, so that n=1. However, when liquid, for example pure water of n=1.44, is used as the medium, the numerical aperture becomes 1.44 times greater. Thus, the energy density imposed on the member located above or below the fuse element 20 is not only further decreased, but also the power itself of the laser beam to be irradiated can be set as low as possible. Further, since heat generated by the irradiation with the laser beam is efficiently cooled by the pure water, which is the medium, it is possible to further decrease the damage imposed on the member near the fuse element 20.

A method of manufacturing the semiconductor device according to this embodiment is explained next.

FIG. 11 to FIG. 15 are schematic cross sections of a preferable method of manufacturing the semiconductor device according to this embodiment in order of manufacturing steps.

Figure 11:
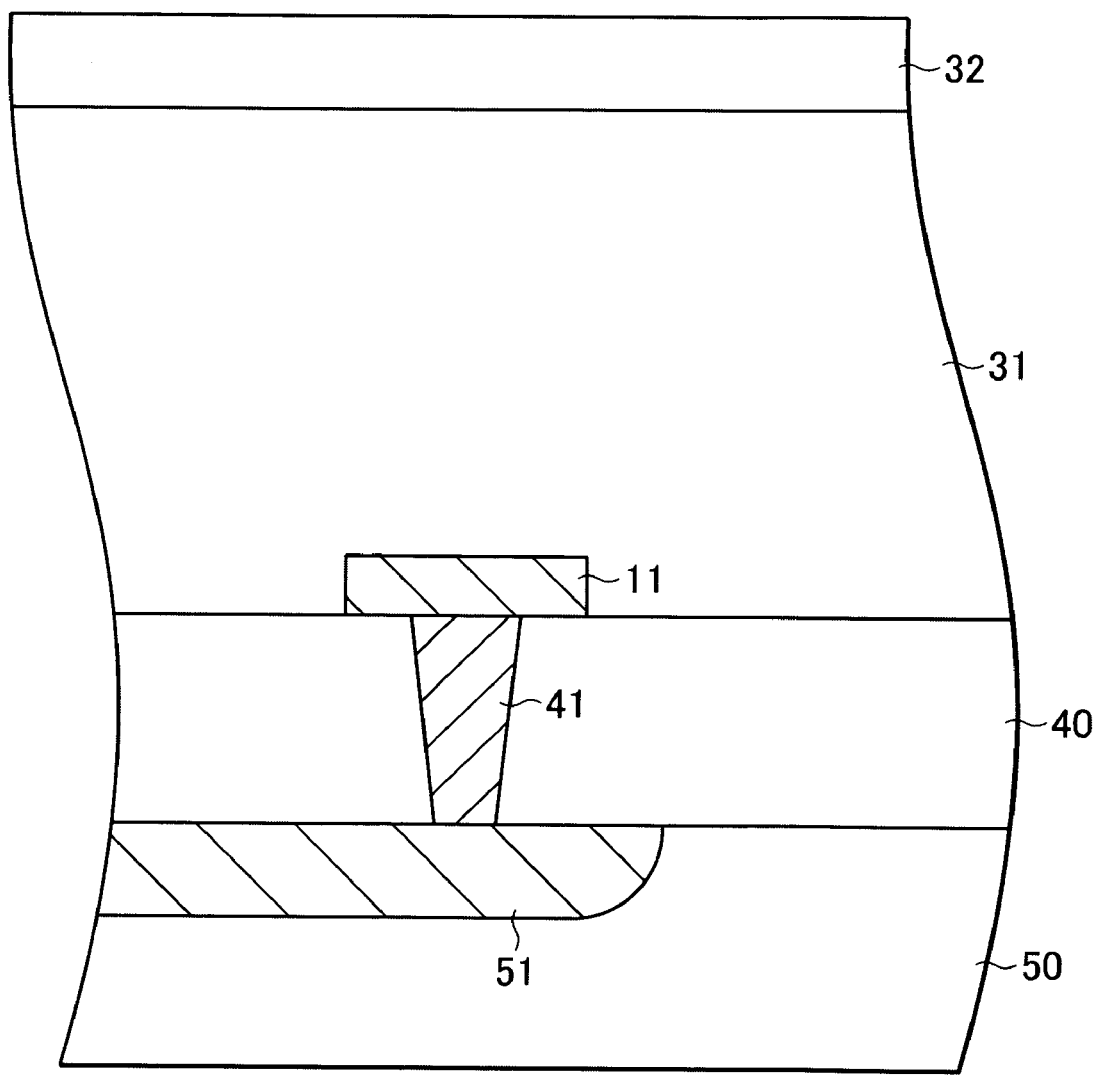
FIG. 11 is a process diagram showing a process of forming dielectric films on lower electrode that is a part of the manufacturing process of the semiconductor device according to the embodiment of the present invention.

As shown in FIG. 11, the lower electrode 11 is formed on the insulating film 40. Thereafter, the insulating films 31 and 32 are formed in this order. At this time, to form the insulating film 31 and the insulating film 32, materials different from each other are selected. For example, when a silicon dioxide film ($SiO_2$) is selected as the material for the insulating film 31, a silicon nitride film ($Si_3N_4$) is selected as the material for the insulating film 32. As for a film thickness, the film thickness of the insulating film 31 is set to be relatively thick, and that of the insulating film 32 is set to be relatively thin. Since the total film thickness of the insulating films 31 and 32 defines the height H of the fuse element 20, the total film thickness of these films is preferably 1 μm or more, and more preferably, about 3 μm.

Figure 12:
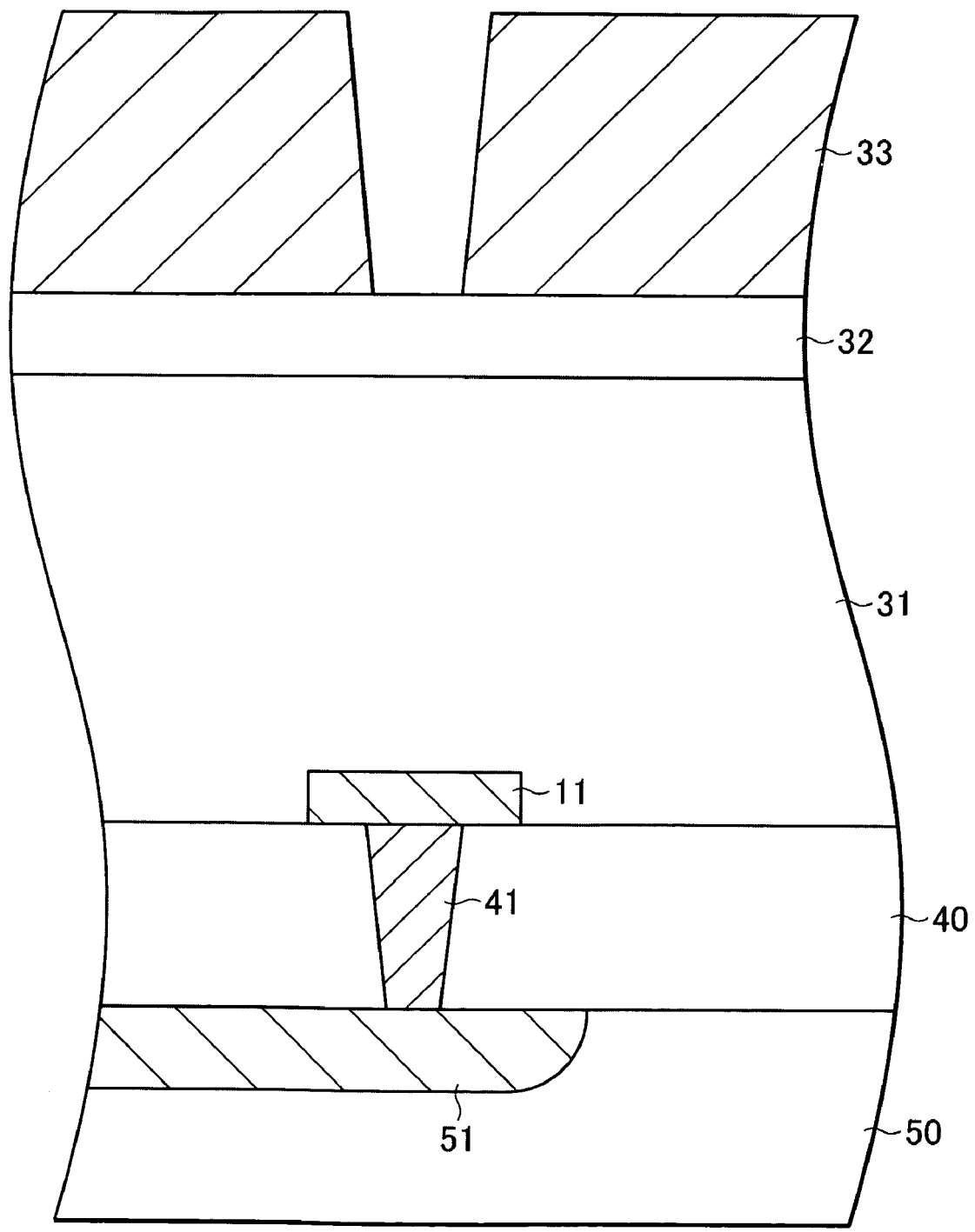
FIG. 12 is a process diagram showing a process of forming a photoresist that is a part of the manufacturing process of the semiconductor device according to the embodiment of the present invention.

A photoresist 33 is then formed on the surface of the insulating film 32, as shown in FIG. 12. The photoresist 33 is patterned by a photolithography method so that an area of the insulating film 32, in which the fuse element 20 is to be formed, is exposed. In this state, the insulating films 32 and 31 are continuously etched. The conditions for the etching are that an etching rate for the insulating film 32 is relatively small, and an etching rate for the insulating film 31 is relatively large. At this time, an etching rate for the lower electrode 11 needs to be sufficiently small so as to make the lower electrode 11 function as an etching stopper.

Figure 13:
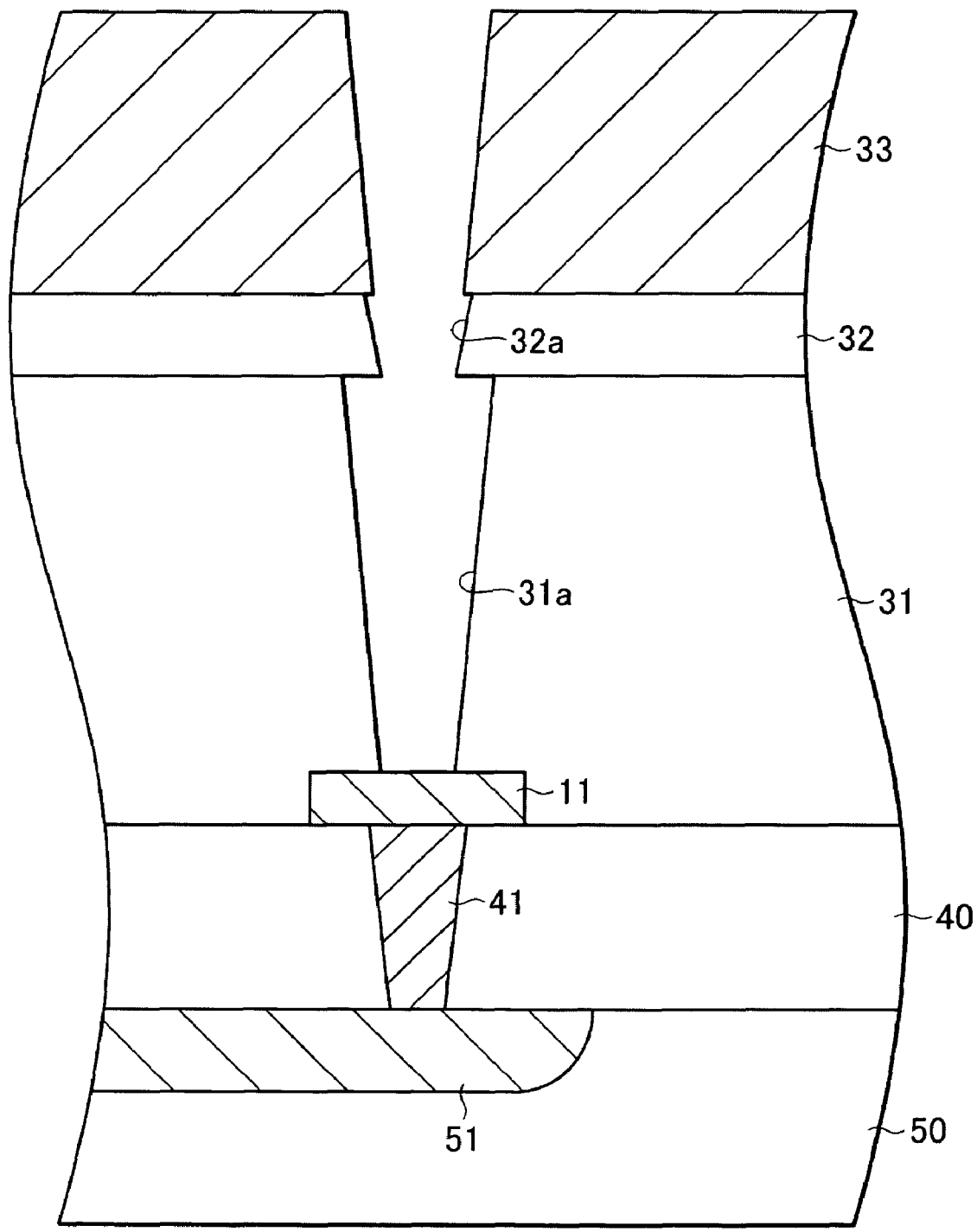
FIG. 13 is a process diagram showing a process of forming through-holes that is a part of the manufacturing process of the semiconductor device according to the embodiment of the present invention.

Thus, through-holes 31a and 32a that reach the lower electrode 11 are formed in the insulating films 31 and 32, as shown in FIG. 13. At this time, since the etching rate for the insulating film 31 is larger than the etching rate for the insulating film 32, the diameter at a lower end of the through-hole 32a is smaller than the diameter at an upper end of the through-hole 31a. That is, at a boundary between the insulating film 31 and the insulating film 32, there is obtained an overhang shape having a constricted portion.

Figure 14:
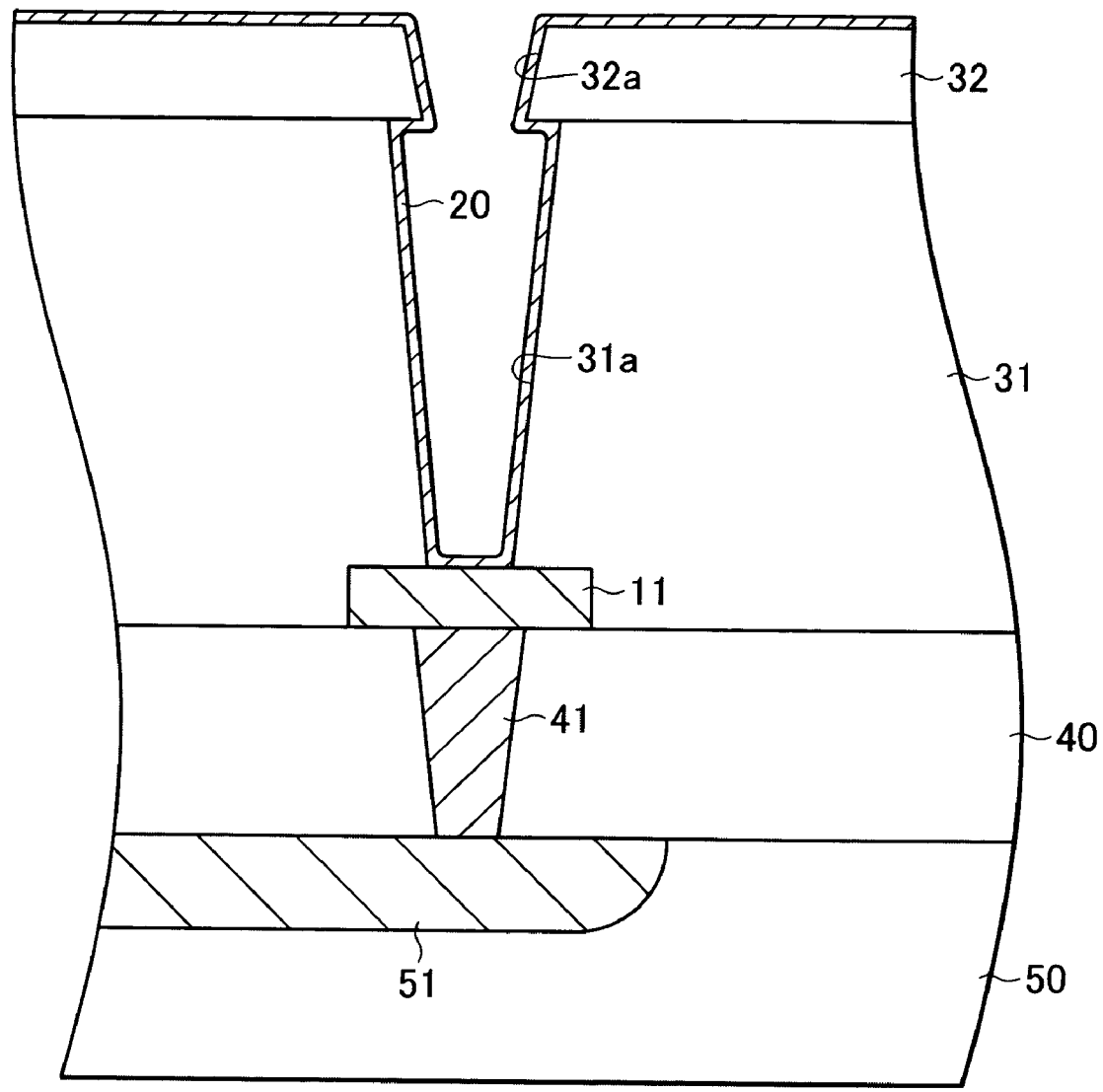
FIGS. 14 and 15 are process diagrams showing a process of forming fuse element that is a part of the manufacturing process of the semiconductor device according to the embodiment of the present invention.

The photoresist 33 is then removed. Subsequently, a conductor that serves as a material for the fuse element 20 is grown by using a film formation method of example CVD, excellent in coverage, as shown in FIG. 14. When tungsten (W) is selected as the material for the fuse element 20, for example, a plasma CVD method can be employed, in which tungsten hexafluoride ($WF_6$) and a hydrogen gas ($H_2$) are used as material gas.

Figure 15:
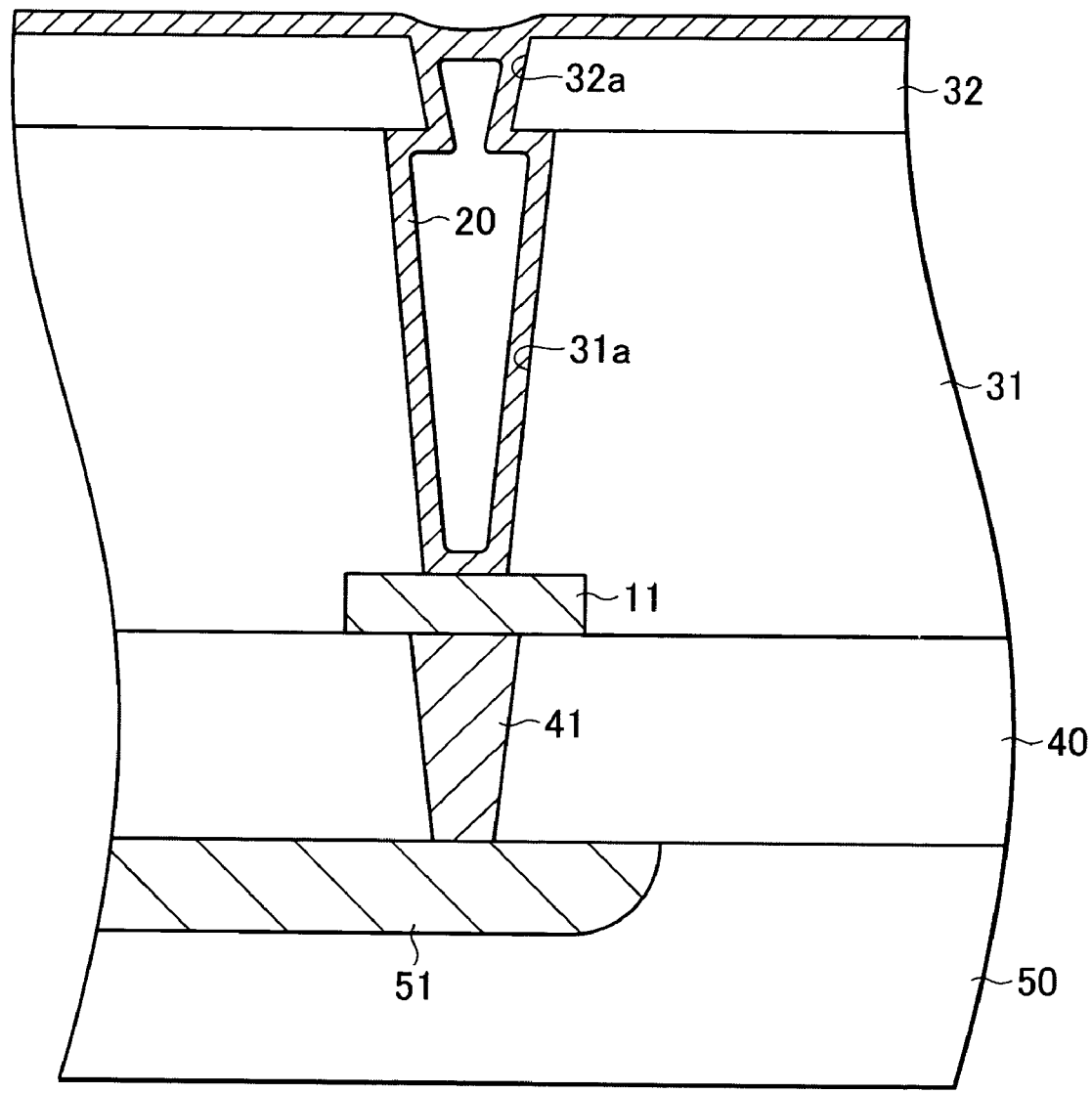

As a result, materials of the fuse element 20 are deposited on inner walls of the through-holes 31a and 32a. However, since the through-holes 31a and 32a have an overhang shape, the through-hole 32a, which serves as an entrance of the material gas, is firstly buried before the interior of the through-hole 31a is filled with the conductor, as shown in FIG. 15. That is, the through-hole 31a is left with the hollow portion 20a. The material gas is contained in this hollow portion. When there is a slight gap in the through-hole 32a, besides the material gas, carrier gas, such as nitrogen gas ($N_2$), and argon gas (Ar) for discharging the material gas is contained.

Thereafter, an unnecessary conductor formed on the surface of the insulating film 32 is removed, the upper electrode 12 contacting the fuse element 20 is formed, and the passivation film 60 covering the upper electrode 12 is formed, to complete the semiconductor device according to this embodiment. According to the method explained above, it is possible to surely form the fuse element 20 having the hollow portion 20a.

Figure 16:
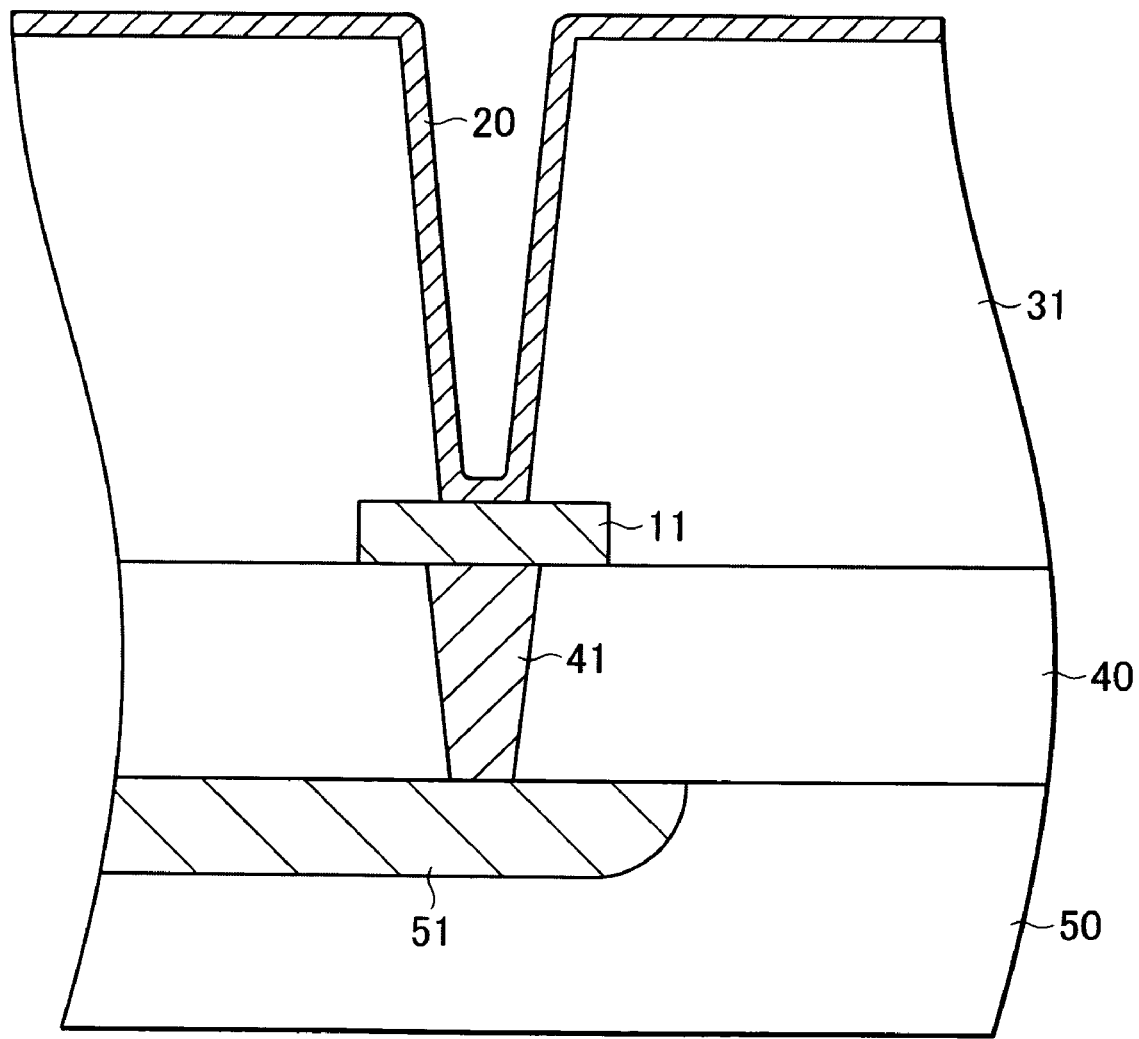
FIG. 16 is a process diagram showing another process of forming fuse element by using a film formation method excellent in coverage.
Figure 17:
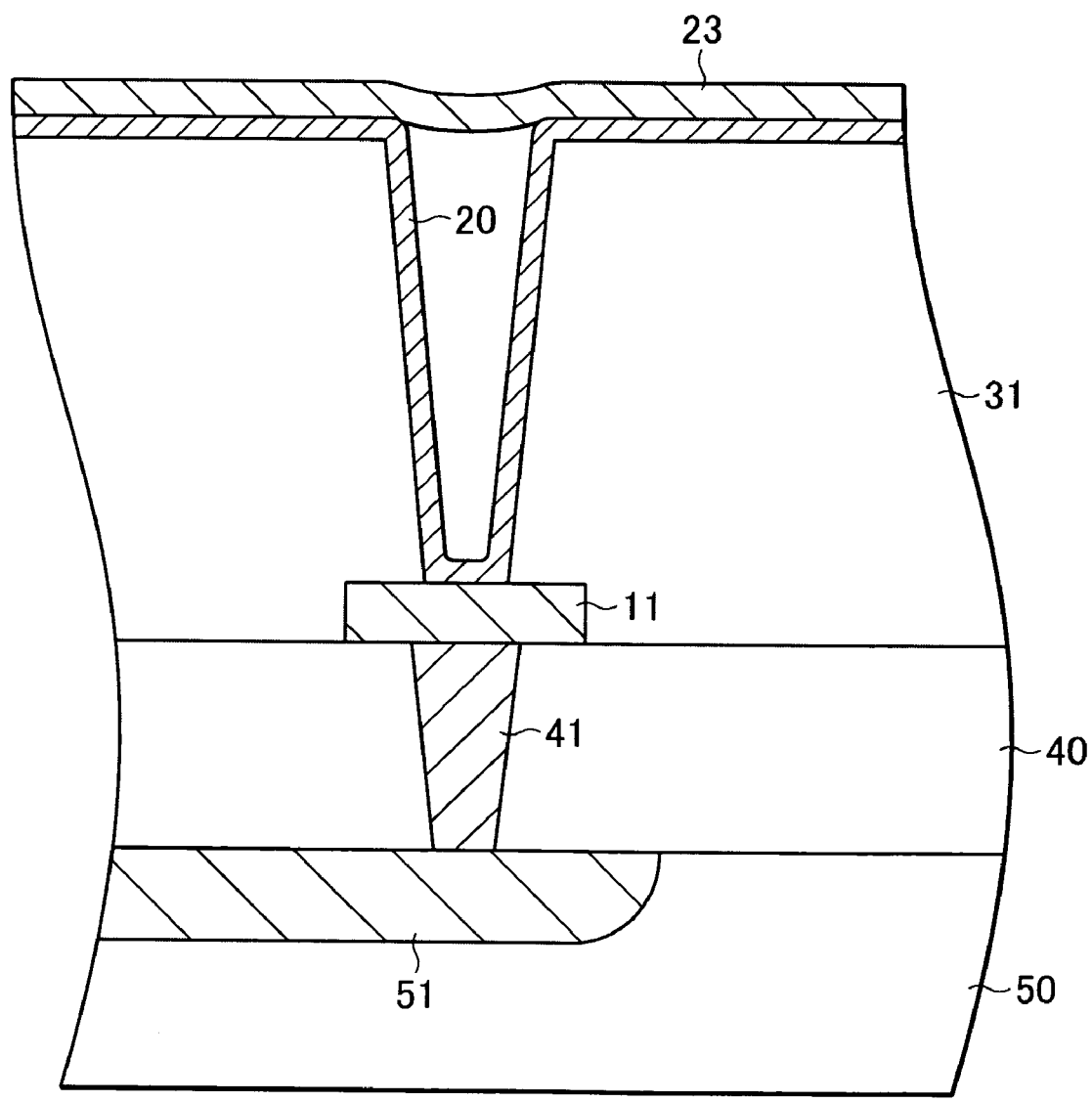
FIG. 17 is a process diagram showing another process of forming fuse element by using a film formation method low in coverage.

The method of forming the fuse element 20 having the hollow portion 20a is not limited to the one explained, and another method can be employed. For example, the conductor, which serves as the fuse element 20, is firstly grown on the inner wall of the through-hole 31a by using a film formation method of example CVD, excellent in coverage, as shown in FIG. 16. Thereafter, another conductor 23 is grown by using a film formation method of example a sputtering method, low in coverage, as shown in FIG. 17. Thus, the fuse element 20 can be formed. In this case, the insulating film 32 is not necessary.

As explained above, according to this embodiment, the energy of the laser beam is efficiently absorbed by the fuse element 20, and the margin of the focal position in the up and down directions is sufficiently secured. Thus, it becomes possible to perform a trimming that uses the objective lens having a large numerical aperture and the laser beam having a weak power.

Thus, it becomes possible to perform a laser trimming without substantially destructing the passivation film, so that it is possible to prevent a decrease in reliability, which is caused by the destruction of the passivation film, of the semiconductor device. In addition, since almost no debris occurs at the time of the trimming, almost no debris adheres to the objective lens.

Since it is possible to perform the trimming by using the objective lens having a large numerical aperture and the laser beam having a weak power, it becomes not only possible to arrange another wiring below or above the fuse element, but also possible to set the distance between the adjacent fuse elements narrow. Therefore, it is also possible to increase an integration density.

The present invention is in no way limited to the aforementioned embodiments, but rather various modifications are possible within the scope of the invention as recited in the claims, and naturally these modifications are included within the scope of the invention.

For example, in the embodiment, the fuse element 20 having the hollow portion 20a is used. However, the hollow portion 20a is not necessarily arranged as long as the lower electrode 11 and the upper electrode 12 can be insulated by the laser trimming.

In the embodiment, the lower electrode 11 is connected to the diffused layer 51 via the through-hole electrode 41. However, the diffused layer 51 itself can be used as the lower electrode.

What is claimed is:

1. A semiconductor device, comprising:
a plurality of lower electrodes arranged in a first wiring layer;
a plurality of upper electrodes arranged in a second wiring layer located higher than the first wiring layer; and
a plurality of fuse elements, each of said plurality of fuse elements being connected between a corresponding one of said plurality of lower electrodes and a corresponding one of said plurality of upper electrodes, a distance between adjacent fuse elements of said plurality of fuse elements being smaller than a height of the adjacent fuse elements.

2. The semiconductor device as claimed in claim 1, wherein the fuse elements have a tubular shape having a hollow portion.

3. The semiconductor device as claimed in claim 1, further comprising a wiring that is arranged in a third wiring layer located lower than said first wiring layer and that is located below at least one of said plurality of fuse elements.

4. The semiconductor device as claimed in claim 1, further comprising a wiring that is arranged in a third wiring layer located higher than said second wiring layer and that is located above at least one of said plurality of fuse elements.

5. A semiconductor device, comprising:
a lower electrode arranged in a first wiring layer;
an upper electrode arranged in a second wiring layer located higher than the first wiring layer; and
a fuse element that connects the lower electrode and the upper electrode, a height of the fuse element being greater than a depth of focus of a laser beam to be irradiated.

6. The semiconductor device as claimed in claim 5, wherein a diameter of the fuse element is smaller than a diffraction limit of the laser beam.

7. The semiconductor device as claimed in claim 5, wherein the fuse element has a tubular shape having a hollow portion.

8. A semiconductor device, comprising:
a lower electrode arranged in a first wiring layer;
an upper electrode arranged in a second wiring layer located higher than said first wiring layer; and
a fuse element that connects said lower electrode and said upper electrode, said fuse element having a tubular shape having a hollow portion therein.

9. The semiconductor device as claimed in claim 8, wherein said fuse element includes a first tubular portion located on said lower electrode side and a second tubular portion located on said upper electrode side, and a diameter at a lower end of said second tubular portion is smaller than a diameter at an upper end of said first tubular portion.

10. The semiconductor device as claimed in claim 8, wherein said hollow portion has a volume equal to or larger than that of said fuse element.

11. The semiconductor device as claimed in claim 8, wherein said fuse element has a height at least three times greater than a diameter of the fuse element.

12. The semiconductor device as claimed in claim 8, further comprising a wiring that is arranged in a third wiring layer located lower than said first wiring layer and that is located below said fuse element.

13. The semiconductor device as claimed in claim 8, further comprising a wiring that is arranged in a third wiring layer located higher than said second wiring layer and that is located above said fuse element.

14. A semiconductor device, comprising:
a lower electrode arranged in a first wiring layer;
an upper electrode arranged in a second wiring layer located higher than the first wiring layer;
a fuse element connected between said lower electrode and said upper electrode; and a wiring arranged in a third wiring layer located lower than said first wiring layer and located below said fuse element.

15. The semiconductor device as claimed in claim 14, wherein said fuse element has a height at least three times greater than a diameter of said fuse element.

16. A semiconductor device, comprising:
a lower electrode arranged in a first wiring layer;
an upper electrode arranged in a second wiring layer located higher than the first wiring layer;
a fuse element connected between said lower electrode and said upper electrode; and
a wiring arranged in a third wiring layer located higher than said second wiring layer and located above said fuse element.

17. The semiconductor device as claimed in claim 16, wherein said fuse element has a height at least three times greater than a diameter of said fuse element.

18. A semiconductor device comprising:
a lower electrode arranged in a first wiring layer;
an insulating layer formed on said lower electrode and having a through-hole;
an upper electrode arranged in a second wiring layer formed on said insulating layer; and
a fuse element formed on an inner wall and bottom of said through-hole, and connected between said lower electrode and said upper electrode.

19. The semiconductor device as claimed in claim 18, wherein said fuse element has a tubular shape having a hollow portion therein.

20. The semiconductor device as claimed in claim 19, wherein said hollow portion has a volume equal to or larger than that of said fuse element.

21. The semiconductor device as claimed in claim 18, wherein said fuse element, includes a first tubular portion located on said lower electrode side and a second tubular portion located on said upper electrode side, and a diameter at a lower end of said second tubular portion is smaller than a diameter at an upper end of said first tubular portion.

22. The semiconductor device as claimed in claim 18, wherein said fuse element has a height at least three times greater than a diameter of the fuse element.

23. The semiconductor device as claimed in claim 18, further comprising a wiring that is arranged in a third wiring layer located lower than said first wiring layer and that is located below said fuse element.

24. The semiconductor device as claimed in claim 18, further comprising a wiring that is arranged in a third wiring layer located higher than said second wiring layer and that is located above said fuse element.

* * * * *